United States Patent
Zanchi et al.

(10) Patent No.: US 7,411,532 B2
(45) Date of Patent: Aug. 12, 2008

(54) METHOD FOR DETERMINING MINIMIZATION FACTOR FOR IMPROVING LINEARITY OF AN ANALOG-TO-DIGITAL CONVERTER

(75) Inventors: Alfio Zanchi, Colorado Springs, CO (US); Kevin Quynh Nguyen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 166 days.

(21) Appl. No.: 11/514,554

(22) Filed: Aug. 31, 2006

(65) Prior Publication Data

US 2007/0046510 A1 Mar. 1, 2007

Related U.S. Application Data

(60) Provisional application No. 60/713,169, filed on Aug. 31, 2005.

(51) Int. Cl.
*H03M 1/10* (2006.01)
(52) U.S. Cl. ...................... 341/120; 341/155
(58) Field of Classification Search .......... 341/120–155
See application file for complete search history.

(56) References Cited

U.S. PATENT DOCUMENTS

| 5,635,937 | A |   | 6/1997  | Lim et al.              |
|-----------|---|---|---------|-------------------------|
| 5,659,312 | A | * | 8/1997  | Sunter et al. ... 341/120 |
| 5,712,633 | A | * | 1/1998  | Bae ............. 341/120 |
| 5,861,826 | A | * | 1/1999  | Shu et al. ...... 341/120 |
| 5,973,631 | A | * | 10/1999 | McMullen et al. ... 341/121 |
| 6,140,949 | A |   | 10/2000 | Tsay et al.             |
| 6,437,724 | B1 | * | 8/2002 | Nagaraj ......... 341/155 |
| 6,882,294 | B2 |   | 4/2005 | Linder et al.           |

OTHER PUBLICATIONS

Lin et al.; "A 13-b 2.5-MHz Self-Calibrated Pipelined A/D Converter in 3-microm CMOS"; IEEE Journal of Solid-State Circuits; vol. 26, No. 4; Apr. 1991; pp. 628-636.

Moreland et al.; "A 14-bit 100-Msample/s Subranging ADC"; IEEE Journal of Solid-State Circuits; vol. 35, No. 12; Dec. 2001; pp. 1791-1798.

Pelgrom et al.; "Transistor matching in analog CMOS applications"; IEEE International Electron Devices Meeting (IEDM '98) Technical Digest; Dec. 1998; pp. 915-918.

* cited by examiner

*Primary Examiner*—Lam T Mai
(74) *Attorney, Agent, or Firm*—Wade J. Brady, III; Frederick J. Telecky, Jr.

(57) ABSTRACT

A method for determining a minimization factor for improving linearity of an analog-to-digital converter including a plurality of components includes the steps of: (a) Evaluating integral non-linearity response of the apparatus to identify significant departures of the response greater than a predetermined amplitude and to relate each respective significant departure with a respective identified component. (b) Determining magnitude of each significant departure. (c) Identifying a trimming factor related with each component. (d) Determining a residual gap magnitude for each significant departure. The residual gap magnitude comprises the magnitude of the respective significant departure less the trimming factor related with the identified component. (e) Determining the minimization factor as a sum of the residual gap magnitudes for a selected plurality of the identified components.

20 Claims, 1 Drawing Sheet

METHOD FOR DETERMINING MINIMIZATION FACTOR FOR IMPROVING LINEARITY OF AN ANALOG-TO-DIGITAL CONVERTER

This application claims benefit of prior filed copending Provisional Patent Application Ser. No. 60/713,169, filed Aug. 31, 2005.

BACKGROUND OF THE INVENTION

The present invention is directed to analog-to-digital converter apparatuses, and especially to a method for improving linearity of performance for an analog-to-digital converter apparatus.

The so-called "pipelined" architectures for Analog-to-Digital Conversion (ADC) rely on the concept of simultaneous data sub-conversion in multiple stages in order to progressively refine the digital representation of an analog signal. There are two fundamental approaches to pipelined ADC: switched-capacitor and switched-current. In both of these approaches, ADC apparatuses are impacted by the matching of components employed in the local quantization path of each stage.

Switched-current designs will suffer from mismatches between the elements of the folding sub-ADC, and from mismatches among the current source elements constituting the reconstruction DAC (Digital-to-Analog Converter). The DAC could be segmented in different ways to vary the impact of the mismatch. However, once the mismatch between the elementary DAC elements has been minimized, the relative current mismatch between first ADC stage and the second ADC stage (and between later stage-pairs) will remain to be addressed.

In switched-capacitor ADC implementations the relative size of the capacitors determines the gain of the stage and also determines the size of the voltage steps in the reconstruction MDAC (Multiplying Digital-to-Analog Converter), directly impacting the integral non-linearity (INL). These technology-related mismatches have become increasingly critical in the latest releases of minimum-feature CMOS (Complementary Metal Oxide Semiconductor) and BiCMOS (Bipolar Complementary Metal Oxide Semiconductor) processes, because the lithographic control over both active and passive devices is more difficult to attain. This technological problem is expected to be exacerbated in the future. The answer by the design community to this challenge led to develop at least two classes of techniques which employ analog rather than digital solutions in order to correct for these mismatches.

All-digital bit-redundancy techniques have proven effective to tackle the sub-ADC imperfections. The sub-DAC non-idealities have been addressed using digital calibration methods (e.g., one-time adjustments or continuous background calibration) or using analog "trimming" of devices impacted by a statistical mismatch.

Non-brute-force trimming techniques depend upon a preliminary identification of the errors affecting the INL (Integral Non-Linearity; measure of departure from the ideal linear transfer curve for an ADC) such as positive or negative gaps. Once the errors have been assessed, the passive components that determine such an ADC behavior can be adjusted to compensate for their non-ideality. For example, selective laser cuts can trim the value of resistors in a DAC to linearize the analog signal translation from the digital word. Alternatively, tiny parasitic capacitors can be switched in parallel to the signal capacitors of a quantizer's stages to counter a process-induced mismatch.

Unless time-consuming, computer processing-consuming and memory-consuming brute force or iterative approaches are followed, the algorithms used to configure the trim circuitry for reducing component mismatches must have available a reliable identification of the INL errors in order to work. For example, in the case of a 16-bit switched-capacitor pipeline ADC, trying out all the different combinations of the trim values, collecting INL or SFDR (Spurious Free Dynamic Range; difference between the Root Mean Square (RMS) value of a desired output signal and the highest amplitude output frequency that is not present in the input) measurements in every instance and finding the best trim code is not a reasonable approach. If every trim device controlled one and one only error the optimization problems would be completely decoupled, and they could be solved with minimal effort. Indeed, especially in the switched-capacitor paradigm where a feedback capacitor controls the gain of the stage and therefore affects mismatches and trimming for a plurality of other components, the passive component change that fixes one mismatch could make other errors or mismatches worse. To properly arrive at a solution, the solutions to every mismatch of an apparatus are coupled and must be found considering all the mismatch errors simultaneously. Unfortunately, for example, a simple 4 bits accurate trim over a 2.5 bit per stage quantizer (4 capacitors (caps) for each stage) produces a string of 4 bits×4 caps=16 bit-long trim word, for a total of $2^{16}$=65,536 permutations for each stage. The simultaneous trimming of the first 2 stages of such a pipeline requires as many as $2^{32}$=4,294,967,296 attempts. Each attempt involves a trim programming and re-measurement process with possible follow-up retrimming and measurement steps. Such an approach is therefore impracticable for most if not all the high-resolution systems available to date.

There is a need for a method for improving linearity of an analog-to-digital converter (ADC) that employs other than brute force to solve mismatch problems.

There is a need for a method for improving linearity of an analog-to-digital converter (ADC) that is non-iterative in that no repetitive trim-and-measure operations are required for its implementation.

SUMMARY OF THE INVENTION

A method for determining a minimization factor for improving linearity of an analog-to-digital converter including a plurality of components includes the steps of: (a) Evaluating integral non-linearity response of the apparatus to identify significant departures of the response from the ideal case greater than a predetermined amplitude, and to relate each respective significant departure with a respective identified component. (b) Determining magnitude of each significant departure. (c) Identifying a trimming factor related with each component. (d) Determining a residual gap magnitude for each significant departure. The residual gap magnitude comprises the magnitude of the respective significant departure less the correction introduced by the trimming factor related with the identified component. (e) Determining the minimization factor as a sum of the weighted, squared, or possibly further processed residual gap magnitudes for a selected plurality of the identified components.

It is, therefore, an object of the present invention to provide a method for improving linearity of an analog-to-digital converter (ADC) that employs other than brute force to solve mismatch problems.

It is a further object of the present invention to provide a method for improving linearity of an analog-to-digital converter (ADC) that is non-iterative in that no repetitive trim-and-measure operations are required for its implementation.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

The term "locus" is intended herein to indicate a place, location, locality, locale, point, position, site, spot, volume, juncture, junction or other identifiable location-related zone in one or more dimensions. A locus in a physical apparatus may include, by way of example and not by way of limitation, a corner, intersection, curve, line, area, plane, volume or a portion of any of those features. A locus in an electrical apparatus may include, by way of example and not by way of limitation, a terminal, wire, circuit, circuit trace, circuit board, wiring board, pin, connector, component, collection of components, sub-component or other identifiable location-related area in one or more dimensions. A locus in a flow chart may include, by way of example and not by way of limitation, a juncture, step, site, function, query, response or other aspect, step, increment or an interstice between junctures, steps, sites, functions, queries, responses or other aspects of the flow or method represented by the chart.

Figure 1:
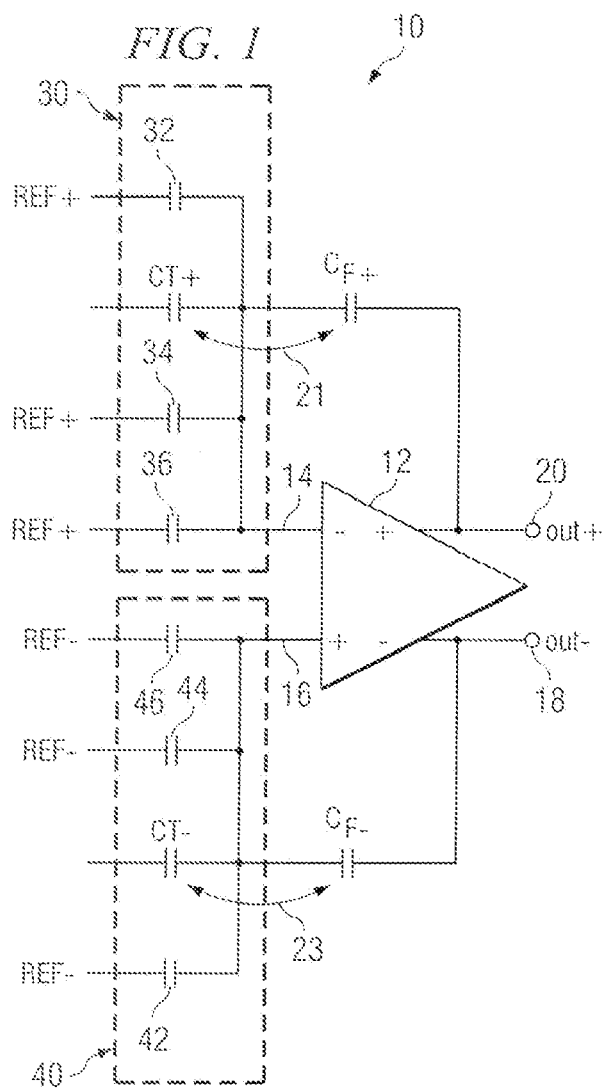
FIG. 1 is a simplified electrical schematic diagram of a switched capacitor analog-to-digital converter stage.

FIG. 1 is a simplified electrical schematic diagram of a switched capacitor analog-to-digital converter stage. In FIG. 1, an ADC (Analog-to-Digital Converter) stage 10 includes an operational amplifier 12 having an inverting input locus 14, a non-inverting input locus 16, an inverting output locus 18 and a non-inverting output locus 20. Operational amplifier 12 may be embodied in an OTA (Operational Transconductance Amplifier). A first capacitor bank 30 is coupled with inverting input locus 14. First capacitor bank 30 includes capacitors 32, 34, 36 coupled in parallel with inverting input locus 14. A second capacitor bank 40 is coupled with non-inverting input locus 16. Second capacitor bank 40 includes capacitors 42, 44, 46 coupled in parallel with non-inverting input locus 16. ADC stage 10 also includes a feedback capacitor CF+ coupled between non-inverting output locus 20 and inverting input locus 14 during the amplification phase of the signal at output 20 of stage 10. During the input sampling phase of the signal at output 20 feedback capacitor CF+ is connected in parallel with capacitor bank 30. The input sampling phase connection of feedback capacitor CF+ is schematically indicated in FIG. 1 by representing CF+ as capacitor CT+ coupled with inverting input locus 14. This alternate employment of feedback capacitor CF+, CT+ is indicated by arrow 21 in FIG. 1.

ADC stage 10 further includes a feedback capacitor CF− coupled between inverting output locus 18 and non-inverting input locus 16 during the amplification phase of the signal at output 18 of stage 10. During the input sampling phase of the signal at output 18 feedback capacitor CF— is connected in parallel with capacitor bank 40. The input sampling phase connection of feedback capacitor CF− is schematically indicated in FIG. 1 by representing CF− as capacitor CT− coupled with non-inverting input locus 16. This alternate employment of feedback capacitor CF−, CT− is indicated by arrow 23 in FIG. 1.

Each respective capacitor 32, 34, 36, 42, 44, 46, CF+, CF− is preferably provided with a trim mechanism (not shown in FIG. 1). The trim mechanism may be embodied in a small trim capacitor coupled for switching inclusion in parallel with a respective capacitor 32, 34, 36, 42, 44, 46, CF+, CF−. Alternatively, laser trimming may be selectively performed on a respective parallel capacitor for each of capacitors 32, 34, 36, 42, 44, 46, CF+, CF− and may be employed for trimming ADC stage 10. Laser trimming may also be employed in an alternate switched-current ADC design (not shown) functionally analogous to ADC stage 10. Such an analogous switched-current design nay employ a pair of structures similar to ADC stage 10 to provide similar differential signal treatment. Trimming may be performed, by way of example and not by way of limitation, to reduce inter-component imbalances within ADC stage 10.

By way of example and not by way of limitation, ADC stage 10 may be embodied in a switched-capacitor 2.5-bits MDAC (Multiplying Digital-to-Analog Converter) stage. Operational amplifier 12 is closed in a feedback loop that defines the residue amplification for a next stage in an ADC (not shown in FIG. 1). The differential design processes differential signals (i.e., substantially equal magnitude and substantially opposite phase) at input loci 14, 16 and constrains each MDAC capacitor 32, 34, 36, 42, 44, 46 to control a pair of gaps astride the center of the INL (Integral Non-Linearity) response. Unlike individual capacitors 32, 34, 36 in capacitor bank 30, feed-back capacitor CF+ affects all the gaps present in the INL. Unlike individual capacitors 42, 44, 46 in capacitor bank 40, feed-back capacitor CF− also affects all the gaps present in the INL. By way of example and not by way of limitation, ADC stage 10 may be embodied in a representative switched-capacitor pipelined 16-bit ADC equipped with an additional binary-weighted bank of capacitors that can be added in parallel to each of the MDAC capacitors 32, 34, 36, 42, 44, 46 in capacitor banks 30, 40, as well as in parallel of each of CF+, CF−, and whose addition is controlled by way of a binary word code herein indicated as "trim code". Adding capacitance in parallel with 32, 34, 36, 42, 44, 46 increases the apparent gain of the ADC stage 10, thereby introducing a positive discontinuity (gap) in the INL manifested as a sharp excursion of the INL response (see FIG. 2). Adding capacitance in parallel with feedback capacitors CF+, CF− (e.g., by programming a trim code that connects any or all of the capacitors in the binary-weighted bank of capacitors in parallel with CF+, CF− within ADC stage 10) decreases the apparent gain of ADC 10, thereby introducing a negative discontinuity (gap) in the INL and counteracting the gap introduced by capacitance changes applied to capacitor banks 30, 40. There is a problem with ascertaining the optimal configuration of the trim network to be employed within ADC stage 10 to achieve the most effective cancellation of inter-component mismatch effects so as to yield the best possible distortion.

Figure 2:
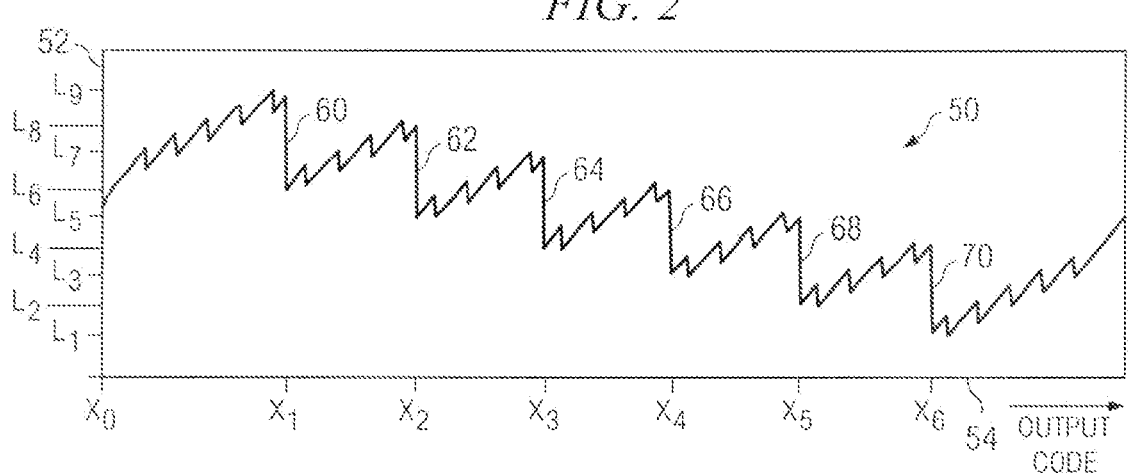
FIG. 2 is a graphic representation of integral non-linearity of the switched capacitor analog-to-digital converter, one stage of which is illustrated in FIG. 1.

FIG. 2 is a graphic representation of integral non-linearity of the switched capacitor analog-to-digital converter stage illustrated in FIG. 1. In FIG. 2, an Integral Non-Linearity (INL) response 50 is illustrated with respect to INL values plotted on a vertical axis 52 and output code values plotted on a horizontal axis 54.

FIG. 2 is an evaluation of INL relating to one side of ADC 10 (FIG. 1) including operational amplifier 12, capacitor bank 30 and feedback capacitor CF+. Analogous INL can be drawn for the other half of stage 10 including operational amplifier 12, capacitor bank 40 and feedback capacitor CF−, but that description is omitted here inorder to avoid prolixity. Regarding FIGS. 1 and 2 together, gaps indicating component non-idealities or mismatches in ADC stage 10 are evident in significant departures or excursions of INL response 50 from an ideal INL response (not shown in FIG. 2). A first gap 60 occurs substantially at output code value X1. Gap 60 is attributable to capacitor 36 and has a magnitude BB1 extending substantially between INL levels L6-L9. A second gap 62 occurs substantially at output code value X2. Gap 62 is attributable to capacitor 34 and has a magnitude BB2 extending substantially between INL levels L5-L8. A third gap 64 occurs substantially at output code value X3. Gap 64 is attributable to capacitor 32 and has a magnitude BB3 extending substantially between INL levels L4-L7. A fourth gap 66 occurs substantially at output code value X4. Gap 66 is also attributable to capacitor 32 and has a magnitude BB4 extending substantially between INL levels L3-L6. A fifth gap 68 occurs substantially at output code value X5. Gap 68 is also attributable to capacitor 34 has a magnitude BB5 extending substantially between INL levels L2-L5. A sixth gap 70 occurs substantially at output code value X6. Gap 70 is also attributable to capacitor 36 and has a magnitude BB6 extending substantially between INL levels L1-L4.

Once the gaps' locations X1-X6 are identified and the amplitudes BB1-BB6 of the discontinuities is extracted from the noisy data, the final set of INL break positions and their respective magnitudes may be computed using automated or non-automated techniques for substitution into one of the new algorithms disclosed herein to deterministically optimize the linearity of the ADC. After the initial brief data collection, the solution is found in one pass as opposed to iterating measurements such as in a repetitive trim-and-measure approach.

Employing the present invention to effect a variety of trim operations, the Inventors have observed improvement of SFDR from 82 dBc (Decibels to carrier) to 91 dBc with a silicon for a 16 bit, 65 MSps (Mega Samples per second), 6 Vpp (Volts peak-to-peak) signal range depending on the trim range available in the device being evaluated (e.g., ADC stage 10). With another silicon design of a 16 bit converter operated at 4 Vpp signal range, the distortion improved even more, going from the low-90's dBc to as high as 102 dBc SFDR.

Once the gaps have been localized and their magnitudes extracted, the solution to the general problem of the device's SFDR optimization can be pursued in at least two distinct ways in the context of a pipelined ADC: (1) INL gaps zeroing, and (2) INL energy zeroing.

Unlike in iterative techniques, the problem of INL optimization can be solved in one-shot fashion by aiming to null out all the gaps as identified through the INL pre-processing. Once the complete series of gap magnitudes and positions is known, the bi-univocal dependence of each gap from the various stages of the pipelined quantizer (from first stage to second stage . . . to the last stage) is also known. The expected effect of the trimming circuit over each gap has been built-in by design, or the effect can be verified in a final product later. The formula that gauges the gap magnitude versus the correction magnitude can therefore be written. For example, with respect to first gap 60 (FIG. 2) occurring at code value X1, its magnitude BB1 (INL values L6-L9) can be identified and quantified. The correction imparted on gap 60 by the trim mechanism will be proportional to the trim control word programmed in the circuit to act on Gap 60. The trim word may be denoted by $x_1$. The proportionality is established through a coefficient $KBB_1$. Thus the correction imparted on gap 60 by the trim mechanism can be written as $KBB_1 \cdot x_1$. In switched-capacitor ADC Stage 10 (FIG. 1) $x_1$ is the trim word controlling the amount of trim capacitance added to the signal capacitor 36 responsible for the specific MDAC (Multiplying Digital-to-Analog Converter) operation affecting Gap60.

The residual gap amplitude that is left after trimming has been applied to ADC stage 10 can be calculated as:

$$(BB_1 - KBB_1 \cdot x_1) \quad [1]$$

The global FoM (Figure of Merit) weighting all the amplitudes of the gaps as corrected by trim can be defined as the sum of all the terms of the kind written above in expression [1]. In order to prevent mutual cancellation between gap errors of opposite sign (errors that do impact the SFDR; even though they cancel out in the INL) the square, rather than the absolute value, of expression [1] may be used in the sum. The quantification of the total residual errors can then be defined as:

$$\sum_{i=1}^{\#BB} (BB_i - KBB_i \cdot x_i)^2 \quad [2]$$

which defines the minimization target for the algorithm. There are six gaps in the response curve illustrated in FIG. 2: that is, the number of BBi factors is 6 in this exemplary case.

The FoM can be made more complicated as required by the trim mechanism. By way of example and not by way of limitation, the trim word $X_F$ applied to feedback capacitor CF+ on ADC stage 10 (FIG. 1) affects all the INL gaps also including gaps individually controlled by capacitors 32, 34, 36, but in the opposite direction. The correction made to $BB_1$ is not only due to the modulation of the charge coming from the MDAC operation but also due to the gain modulation introduced by feedback capacitor CF+. Thus expression [2] can be made to include a feedback adjustment term $(-KBB_F \cdot x_F)$:

$$\sum_{i=1}^{\#BB} (BB_i - (KBB_i \cdot x_i - KBB_F \cdot x_F))^2 \quad [3]$$

where $x_F$ is the trim term controlling the feedback device CF+ and $KBB_F$ is the impact (theoretical or measured) by feedback capacitor CF+ over magnitudes of all gaps 60, 62, 64, 66, 68, 70. When present, this additional feedback adjustment term couples all of the elementary square terms of the FoM, greatly complicating the quest for the best trim code. But unlike sequential algorithms where each INL gap is trimmed as a single entity, for instance proceeding from left to right in the INL plot (FIG. 2), the present invention analyzes the FoM as a whole and finds not a local minimum for each gap, but finds the absolute global minimum for an apparatus in its entirety. In fact the FoM as expressed in expressions [2] and [3] holds the set of trim words as the only variables.

When the trimming mechanism is extended to further stages of a pipeline, the FoM can be complemented by additional terms of similar kind. By way of example and not by way of limitation, for the first and second stage the FoM is:

$$\sum_{i=1}^{\#BB} (BB_i - KBB_i \cdot x_i + KBB_F \cdot x_F)^2 + \sum_{j=1}^{\#SB} (SB_j - KSB_j \cdot x_j + KSB_F \cdot x_F)^2 \quad [4]$$

(BB identifies gaps or breaks due to first stage, and SB identifies gaps or breaks due to the second stage); and so on along the various stages of the pipeline structure. Algorithms within the conjugate gradient family (e.g., Nelder-Mead and Levenberg-Marquardt) may be used to seek a minimum value for the FoM. A more practical approach, given the limited set of functions usually available in commercial tester platforms, involves simply calculating the FoM for a set of values of the trim word, and the minimum may be obtained by mere comparison. No time-consuming re-measurement is needed in this process. The search for a minimum value for the FoM in this practical approach may be performed in a variety of ways, including by way of example and not by way of limitation: (1) A sheer brute-force method (though this is brute force on calculations only), if the number of permutations of the bits composing the trim word is reasonably low. (2) A divide-and-conquer method, to reduce the number of combinations of terms for calculation. For instance, if 16 bits compose the trim word for the first stage of a pipeline and also 16 bits trim the second stage, an impractical total of 4,294,967,296 combinations should be tried with a brute-force approach. Instead, only $2 \cdot 2^{16} = 131,072$ trials are necessary if the second stage trim is considered decoupled from the first stage and trimmed separately. This technique can be more or less effectively employed depending on the amount of interaction the trimming of one stage exhibits over other stages. (3) A dichotomic search method, where the optimal trim word is found by successive approximation. On a 4-bit word X, for example (hexadecimal 0 thru F), the trim range can be partitioned into three regions and a set of three initial "seeds" can be tried out in the FoM as written in expression [4] (e.g. 3, 8, D). The best FoM found is chosen to seed the new iteration of the algorithm. For example if trim word X=3 returned the best FoM, the next values probed can be 1, 3, 5. Then if the best is trim word X=5, the codes 4, 5, 6 can be investigated. This approach is not as exhaustive as a brute-force approach, but its complexity (and, therefore, its processing time) is logarithmically lower than a brute-force approach. The technique can be more or less effectively employed depending on the monotonicity, and linearity of the trimming (which might be difficult to achieve in silicon due to mismatch on the elements of the trim circuitry itself).

The algorithms of the present invention will reduce each gap to a minimum, yielding a smoother INL response. As a consequence, any odd-order or even-order bowing induced by the front-end circuitry before the device being evaluated (e.g., front-end circuitry before ADC stage 10; FIG. 1) into the INL will not be addressed. In fact, the global shape will no longer be "scrambled" by the presence of random gaps, which can sometimes mask out the S-shapes, and sometimes even a worse SFDR may be returned as a consequence.

The same principle that limits the performance achieved by INL gap zeroing described above can be exploited in an alternative procedure which will be referred to in this description as INL energy zeroing. Rather than aiming to nullify the gaps as sought using INL gap zeroing, the INL energy zeroing approach minimizes the total area underneath the INL curve, i.e. the "distance" in a Least-Mean-Squares (LMS) sense between the real INL and the ideal case of zero-error INL. In FIG. 2 a zero-error INL would coincide with a horizontal line at zero levell, generally in the range of level L5. This and other different approaches may be implemented by simply varying how the FoM is defined.

The INL energy zeroing technique is based in a realization that the SFDR is more negatively impacted by the average discrepancy between the INL and zero, than by single features found in a sub-region of the code span (such as the magnitude of INL gaps, as used in the INL gap zeroing approach). Rather than seeking to minimize the local gaps and make any bowing uninterrupted and thus more evident (as in the INL gap zeroing approach), the INL energy zeroing method or approach targets the LMS solution of the problem: INL≡0.

For this purpose, a general expression of the area under the INL response curve must be sought. Rather than focusing on the gap amplitudes, the magnitudes of the INL values, or departures from the ideal case, before and after each gap must be ascertained and minimized. By way of example and not by way of limitation, if the INL value or height of the point immediately before the first gap (gap 60; FIG. 2) due to the first stage is denoted by LBB1 (L for LEFT), and when the squares are taken to avoid sign cancellations, the contribution by LBB1 to the FoM will be, in the simplest case:

$$(LBB_1)^2 \quad [5]$$

Then, the contribution of the point immediately after the first gap 60, of original height RBB 1, after trimming will be modified by the amount of gap correction exercised. The modified INL departure from the ideal case, as affected by trimming, can be expressed as:

$$(RBB_1 - (KBB_1 \cdot x_1 - KBB_F \cdot x_F))^2 \quad [6]$$

and the next point (before second gap 62; FIG. 2) can be expressed as:

$$(LBB_2 - (KBB_1 \cdot x_1 - KBB_F \cdot x_F))^2 \quad [7]$$

and yet the next point will be impacted by both corrections done on the two gaps preceding it, that is:

$$(RBB_2 - (KBB_1 \cdot x_1 + KBB_2 \cdot x_2 - 2KBB_F \cdot x_F))^2 \quad [8]$$

and so on for the ensuing terms. The final formula may be generalized as:

$$\sum_{i=1}^{\#BB}\left(LBB_i - \left(\sum_{j=1}^{i-1}(KBB_j \cdot x_j - (i-1) \cdot KBB_F \cdot x_F)\right)\right)^2 +$$
$$\sum_{k=1}^{\#BB}\left(RBB_k - \left(\sum_{l=1}^{k}(KBB_l \cdot x_l - k \cdot KBB_F \cdot x_F)\right)\right)^2$$

with the first term addressing all the points to the left of the gaps, and the second term addressing all the points to the right of the gaps. In reality, since the INL collected is generally normalized to zero at the extremes (For example, in FIG. 2 response 50 is substantially equal at level L5 at code X5 and at its right extreme. Response 50 could be normalized at zero by shifting response 50 from level L5 to zero), all the error magnitude terms in expression [9] must be de-slanted by the cumulative INL slope before any FoM is calculated. The total slope adjustment is identified as the sum of all the gap corrections:

$$\sum_{i=1}^{\#BB}(KBB_i \cdot x_i - KBB_F \cdot x_F) \quad [10]$$

In order to subtract the unwanted ramp term, each INL height point (LBBi, RBBi) will be adjusted against this slope; which is accomplished by using expression [10], divided by the total number of codes, and multiplied by the position of the gap under investigation. Since the slope depends on the total amount of gap correction introduced in the formula, it is another mechanism through which every trim coefficient affects every region of the INL.

The algorithm can now find the minimum of this new FoM, guaranteeing that the combination of (1) the INL magnitude variations induced by directly modifying the gaps; and (2) the variation of the general INL response bowing profile induced by modulating the gaps, forces the INL to lie as close as possible to the X-axis, i.e. the zero-error ideal case. If there is no bowing in the INL, the optimum found by the energy-zeroing algorithm (expression [9], adjusted using expression [10]) coincides with the optimum of the gaps zeroing algorithm (expression [3] or expression [4]). However, if there is a shaping in the original INL response curve, the energy-zeroing algorithm will find the best combination of gaps that counters the S-shape of the INL response curve and brings the trimmed INL response curve as close as possible to ideal, and possibly effects a minimum SFDR.

Figure 3:
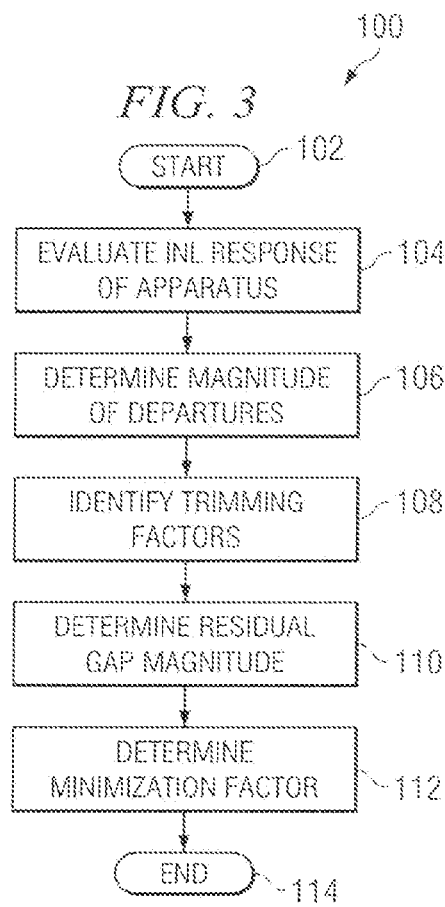
FIG. 3 is a flow chart illustrating the present invention.

FIG. 3 is a flow chart illustrating the present invention. In FIG. 3, a method 100 for determining a minimization factor for use in improving linearity of an analog-to-digital converter apparatus begins at a START locus 102. The apparatus includes a plurality of components. Method 100 continues with the step of effecting an evaluation of integral non-linearization (INL) response of the apparatus, as indicated by a block 104. The evaluation identifies respective significant departures of the INL response. Each respective significant departure has an amplitude greater than a predetermined amplitude. The evaluation relates each respective significant departure with a respective identified component of the plurality of components.

Method 100 continues with the step of determining magnitude of each of the respective significant departures, as indicated by a block 106.

Method 100 continues with the step of identifying a trimming factor related with each respective component, as indicated by a block 108.

Method 100 continues with the step of determining a residual gap magnitude for each the respective significant departure, as indicated by a block 110. The residual gap magnitude for each respective significant departure comprises the magnitude of the respective significant departure less the trimming factor related with each respective identified component.

Method 100 continues with the step of determining the minimization factor for the apparatus, as indicated by a block 112. The minimization factor comprises a sum of the residual gap magnitudes for a selected plurality of the respective identified components.

Method 100 terminates at an END block 114.

The traditional approaches to data converters trimming are based on iterative algorithms which require the measurements of some direct or indirect Figures of Merit (FoM) for the ADC performance to steer the algorithm towards a best solution. FoM's may include by way of example and not by way of limitation, INL, SNR or SFDR. The present invention makes no use of iterative procedures, as demonstrated by the lack of any feedback path in the flowchart of FIG. 3. The present invention is useful for both test operations and product implementation and is amenable to large-scale industrial applications.

U.S. Pat. No. 6,140,949, issued Oct. 31, 2000, to Tsay et al. for "Trimming Algorithm For Pipeline A/D Converter Using Integrated Non-Linearity Measurement" (hereinafter referred to as "Tsay"), discloses trimming inside a switched-capacitor circuit using a bank of small capacitors to be inserted to compensate for mismatch. The INL optimization algorithm of the present invention is more robust that the one proposed by Tsay because the Tsay algorithm requires a mid-code programming and a maximum-minimum code programming before a one-step linear interpolation is performed. Such an interpolation assumes a monotonic characteristic of the trim action of the additive capacitors (or whichever means are adopted to trim-correct the INL) versus the trim code. Such a monotonic characteristic is sometimes impossible to achieve either because of a particular design or because of random mismatch affecting the trim devices themselves. The identification of the sign of the error hypothesized by Tsay (necessary for the Tsay trim algorithm to work) is potentially very difficult to ascertain in a single-pass method.

U.S. Pat. No. 5,635,937, issued Jun. 3, 1997, to Lim et al. for "Pipelined Multi-Stage Analog-To-Digital Converter" (hereinafter referred to as "Lim") discloses a class of solutions of the kind proposed by Tsay in that the Lim algorithms entail some sort of internal "test mode" that can be enabled in the digital part of the circuit and then forced from outside to verify the part's behavior under some predetermined test conditions. In contrast, the present invention does not require any additional internal circuitry beside the normal trim blocks compensating the passives components' mismatch. The present invention does not require that any test mode be enabled. The present invention instead exploits the normal behavior of an ADC as intended for use in a circuit.

U.S. Pat. No. 5,861,826, issued Jan. 19, 1999, to Shu et al. for "Method and Apparatus for Calibrating Integrated Circuit Analog-To-Digital Converters" (hereinafter referred to as "Shu") discloses using a performance-related Figure of Merit (FoM) is used to stop an iterative trimming algorithm once a local maximum (or minimum) is found. Shu requires carrying out numerous experiments, to collect SNR, SFDR, or even INL and DNL adopted as FoMs, and optimizing them via an analytical polynomial fitting of the FoM profiles. In contrast, the present invention requires just two initial measurements of the INL/DNL that are optimized in one non-iterative step, which saves significant amount of test time for data collection and processing.

The present invention does not call for advanced analytical capabilities to be embedded in the tester tools because a straightforward numerical evaluation of a function is performed and the maximum is found by comparison of 2 numbers at a time. Special input/sampling rate conditions had to be sought for the application of Shu's disclosed approach. In contrast, the present invention optimizes INL data as collected whatever clock or input frequency condition may be chosen.

A significant advantage of the present invention is an improvement in the distortion characteristics of an ADC under trimming, measured in terms of the SFDR. The internal properties of the circuit dictate which specific version of the algorithm is more effective-INL gap zeroing, or INL energy zeroing. However, the concept of one-shot optimization without requiring iterative trim-and-measure loops is the common feature of the methods disclosed. In general the INL energy zeroing algorithm yields the best performance at full-range input, but special applications requiring a low level of higher-order harmonics might favor the local INL response curve flatness provided by the INL gap-zeroing algorithm.

The flexibility of the non-iterative principle demonstrated through the two algorithms of the present invention yields the advantage of "application-specific" solution techniques. Both algorithms (and conceivable variants thereof) are one-shot procedures, as opposed to iterative test-and-measure procedures. Although an internal minimum-seeking routine is implemented via a loop, the procedures require only one reading of the INL that is analytically optimized afterwards. This one-reading approach saves a considerable amount of testing time since accurate readings of the INL can take several seconds on a test bench. Further, in general, any bus data transfer from a logic analyzer to a computing unit is a speed bottleneck for an automated ADC trimming operation.

The algorithms disclosed herein do not require any complicated mathematical capability in the automated tools used during testing or trimming. Sum, multiplication, square and comparison are the only library functions required by these trimming algorithmic tools. While more sophisticated gradient methods could be employed to seek a minimum of the INL energy or of the combined INL gaps, a simple calculation of the FoM for each set of trim codes can be repeated, and the minimum found. This circumstance, along with the need for a single INL measurement, substantially contributes to the technique's overall speed and convenience of implementation.

There are no predetermined signals that need to be fed to an ADC in order to implement either algorithm disclosed herein. The ADC is preferably run at the desired sampling rate and input frequency, and standard INLs need to be collected. Either algorithm automatically tries to nullify the non-idealities of the ADC in those specific operating conditions. The optimal behavior of the INL gap zeroing algorithm in terms of SFDR is manifest when no bowing is introduced from the converter's front-end. The INL energy zeroing algorithm allows one to relax even the no-bowing requirement, as it seeks the flattest INL response curve profile. Given a converter equipped with a trim circuitry, the INL energy zeroing zero method can be applied in every condition to ensure the best distortion over the desired input range.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A method for determining a minimization factor for use in improving linearity of an analog-to-digital converter apparatus; said apparatus including a plurality of components; the method comprising the steps of:
   (a) effecting an evaluation of integral non-linearity response of said apparatus; said evaluation identifying respective significant departures of said response; each said respective significant departure having an amplitude greater than a predetermined amplitude; said evaluation relating each respective said significant departure with a respective identified component of said plurality of components;
   (b) determining magnitude of each of said respective significant departures;
   (c) identifying a trimming factor related with each said respective component;
   (d) determining a residual gap magnitude for each said respective significant departure; said residual gap magnitude for each said respective significant departure comprising said magnitude of said respective significant departure less said trimming factor related with each respective said identified component; and
   (e) determining said minimization factor for said apparatus; said minimization factor comprising a sum of said residual gap magnitudes for a selected plurality of said respective identified components.

2. A method for determining a minimization factor for use in improving linearity of an analog-to-digital converter apparatus as recited in claim 1 wherein said apparatus includes at least one feedback component; each respective feedback component of said at least one feedback component influencing operation of a respective plurality of affected components of said plurality of components; said minimization factor for each said respective plurality of affected components including a factor related with said influence by said respective feedback component.

3. A method for determining a minimization factor for use in improving linearity of an analog-to-digital converter apparatus as recited in claim 1 wherein said apparatus includes a plurality of substantially similar stages; the method further comprising repeating steps (a)-(d) for each respective said stage and determining said minimization factor for said apparatus comprising a sum of said residual gap magnitudes for a selected plurality of said respective identified components for each said respective stage.

4. A method for determining a minimization factor for use in improving linearity of an analog-to-digital converter apparatus as recited in claim 1 wherein said selected plurality of said respective identified components includes all of said respective identified components.

5. A method for determining a minimization factor for use in improving linearity of an analog-to-digital converter apparatus as recited in claim 2 wherein said apparatus includes a plurality of substantially similar stages; the method further comprising repeating steps (a)-(d) for each respective said stage and determining said minimization factor for said apparatus comprising a sum of said residual gap magnitudes for a selected plurality of said respective identified components for each said respective stage.

6. A method for determining a minimization factor for use in improving linearity of an analog-to-digital converter apparatus as recited in claim 4 wherein said apparatus includes a plurality of substantially similar stages; the method further comprising repeating steps (a)-(d) for each respective said stage and determining said minimization factor for said apparatus comprising a sum of said residual gap magnitudes for a selected plurality of said respective identified components for each said respective stage.

7. A method for determining a minimization factor for use in improving linearity of an analog-to-digital converter apparatus as recited in claim 2 wherein said selected plurality of said respective identified components includes all of said respective identified components.

8. A method for determining a minimization factor for use in improving linearity of an analog-to-digital converter apparatus as recited in claim 7 wherein said apparatus includes a plurality of substantially similar stages; the method further comprising repeating steps (a)-(d) for each respective said stage and determining said minimization factor for said apparatus comprising a sum of said residual gap magnitudes for a selected plurality of said respective identified components for each said respective stage.

9. A method for determining a minimization factor for use in improving optimizing linearity of an analog-to-digital converter apparatus; the method comprising the steps of:
   (a) effecting an evaluation of integral non-linearity response of said apparatus; said evaluation identifying respective significant departures of said response having an amplitude greater than a predetermined amplitude; said evaluation relating each respective said significant departure with a respective identified component of said plurality of components;
   (b) determining a measured value at a first terminus of each said respective significant departure;
   (c) determining said measured value at a second terminus of each said respective significant departure;

(d) identifying a trimming factor related with each said respective component;

(e) determining a value difference between said measured value at said first terminus of each said respective significant departure and an adjusted said measured value at said second terminus of each said significant departure; said adjusted measured value for each said respective second terminus including at least one of an adjustment relating to said trimming factor related with each respective said identified component and an adjustment relating to said trimming factor related with at least one other identified component than said respective identified component; and (f) determining said minimization factor for said apparatus; said minimization factor comprising a sum of said value differences for a selected plurality of said respective identified components.

10. A method for determining a minimization factor for use in improving linearity of an analog-to-digital converter apparatus as recited in claim 9 wherein said apparatus includes at least one feedback component; each respective feedback component of said at least one feedback component influencing operation of a respective plurality of affected components of said plurality of components; said minimization factor for each said respective plurality of affected components including a factor related with said influence by said respective feedback component.

11. A method for determining a minimization factor for use in improving linearity of an analog-to-digital converter apparatus as recited in claim 9 wherein said apparatus includes a plurality of substantially similar stages; the method further comprising repeating steps (a)-(e) for each respective said stage and determining said minimization factor for said apparatus comprising a sum of said value differences for a selected plurality of said respective identified components for each said respective stage.

12. A method for determining a minimization factor for use in improving linearity of an analog-to-digital converter apparatus as recited in claim 9 wherein said selected plurality of said respective identified components includes all of said respective identified components.

13. A method for determining a minimization factor for use in improving linearity of an analog-to-digital converter apparatus as recited in claim 10 wherein said apparatus includes a plurality of substantially similar stages; the method further comprising repeating steps (a)-(e) for each respective said stage and determining said minimization factor for said apparatus comprising a sum of said value differences for a selected plurality of said respective identified components for each said respective stage.

14. A method for determining a minimization factor for use in improving linearity of an analog-to-digital converter apparatus as recited in claim 12 wherein said apparatus includes a plurality of substantially similar stages; the method further comprising repeating steps (a)-(e) for each respective said stage and determining said minimization factor for said apparatus comprising a sum of said value differences for a selected plurality of said respective identified components for each said respective stage.

15. A method for determining a minimization factor for use in improving linearity of an analog-to-digital converter apparatus as recited in claim 10 wherein said selected plurality of said respective identified components includes all of said respective identified components.

16. A method for determining a minimization factor for use in improving linearity of an analog-to-digital converter apparatus as recited in claim 15 wherein said apparatus includes a plurality of substantially similar stages; the method further comprising repeating steps (a)-(e) for each respective said stage and determining said minimization factor for said apparatus comprising a sum of said value differences for a selected plurality of said respective identified components for each said respective stage.

17. A method for determining at least one minimization factor for use in improving linearity of an analog-to-digital converter apparatus; said apparatus including a plurality of components; the method comprising the steps of:

(a) effecting an evaluation of integral non-linearity response of said apparatus; said evaluation identifying respective significant departures of said response; each said respective significant departure having an amplitude greater than a predetermined amplitude; said evaluation relating each respective said significant departure with a respective identified component of said plurality of components;

(b) determining at least one of:
 (1) magnitude of each of said respective significant departures; and
 (2) a measured value at a first terminus and at a second terminus of each said respective significant departure;

(c) identifying a trimming factor related with each said respective component;

(d) determining at least one of:
 (1) a residual gap magnitude for each said respective significant departure; said residual gap magnitude for each said respective significant departure comprising said magnitude of said respective significant departure less said trimming factor related with each respective said identified component; and
 (2) a value difference between said measured value at said first terminus of each said respective significant departure and an adjusted said measured value at said second terminus of each said significant departure; said adjusted measured value for each said respective second terminus including at least one of an adjustment relating to said trimming factor related with each respective said identified component and an adjustment relating to said trimming factor related with at least one other identified component than said respective identified component; and (e) determining said at least one minimization factor for said apparatus; said at least one minimization factor comprising at least one of:
 (1) a sum of said residual gap magnitudes for a selected plurality of said respective identified components; and
 (2) a sum of said value differences for a selected plurality of said respective identified components.

18. A method for determining at least one minimization factor for use in improving linearity of an analog-to-digital converter apparatus as recited in claim 17 wherein said apparatus includes at least one feedback component; each respective feedback component of said at least one feedback component influencing operation of a respective plurality of affected components of said plurality of components; said minimization factor for each said respective plurality of affected components including a factor related with said influence by said respective feedback component.

19. A method for determining a minimization factor for use in improving linearity of an analog-to-digital converter apparatus as recited in claim 17 wherein said apparatus includes a plurality of substantially similar stages; the method further comprising repeating steps (a)-(d) for each respective said stage and determining said minimization factor for said apparatus comprising at least one of:

(1) a sum of said residual gap magnitudes for a selected plurality of said respective identified components for each said respective stage; and (2) a sum of said value differences for a selected plurality of said respective identified components for each said respective stage.

20. A method for determining a minimization factor for use in improving linearity of an analog-to-digital converter apparatus as recited in claim 18 wherein said apparatus includes a plurality of substantially similar stages; the method further comprising repeating steps (a)-(d) for each respective said stage and determining said minimization factor for said apparatus comprising at least one of:

(1) a sum of said residual gap magnitudes for a selected plurality of said respective identified components for each said respective stage; and (2) a sum of said value differences for a selected plurality of said respective identified components for each said respective stage.

* * * * *